US010134647B2

(12) United States Patent
Fay et al.

(10) Patent No.: US 10,134,647 B2
(45) Date of Patent: Nov. 20, 2018

(54) METHODS FOR FORMING INTERCONNECT ASSEMBLIES WITH PROBED BOND PADS

(71) Applicant: Micron Technology, Inc., Boise, ID (US)

(72) Inventors: Owen R. Fay, Meridian, ID (US); Kyle K. Kirby, Eagle, ID (US); Luke G. England, Urbandale, IA (US); Jaspreet S. Gandhi, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/478,133

(22) Filed: Apr. 3, 2017

(65) Prior Publication Data

US 2017/0207139 A1    Jul. 20, 2017

Related U.S. Application Data

(62) Division of application No. 13/614,286, filed on Sep. 13, 2012, now Pat. No. 9,646,899.

(51) Int. Cl.
*H01L 23/48*    (2006.01)
*H01L 23/52*    (2006.01)
(Continued)

(52) U.S. Cl.
CPC .............. *H01L 22/32* (2013.01); *H01L 22/14* (2013.01); *H01L 24/03* (2013.01); *H01L 24/05* (2013.01); *H01L 24/13* (2013.01); *H05K 999/99* (2013.01); *H01L 2224/02163* (2013.01); *H01L 2224/0391* (2013.01); *H01L 2224/0392* (2013.01); *H01L 2224/0401* (2013.01); *H01L 2224/05567* (2013.01); *H01L 2224/05624* (2013.01); *H01L 2224/13005* (2013.01); *H01L 2224/13012* (2013.01); *H01L 2224/13013* (2013.01); *H01L 2224/13018* (2013.01); *H01L 2224/13022* (2013.01); *H01L 2224/13083* (2013.01);
(Continued)

(58) Field of Classification Search
CPC ......... H01L 22/32; H01L 24/13; H01L 24/03; H01L 22/14; H01L 2224/0401; H01L 2224/05624; H01L 2224/05567; H01L 2224/13083; H01L 2224/0392; H01L 2224/0391; H01L 2224/02163; H01L 2224/13018; H01L 2224/13013; H01L 2224/13005; H01L 2224/13022; H01L 24/05

See application file for complete search history.

(56) References Cited

U.S. PATENT DOCUMENTS 6,384,486 B2 * 5/2002 Zuniga .................... H01L 24/03
                                                               257/780
6,605,528 B1    8/2003 Lin et al.
(Continued)

*Primary Examiner* — William F Kraig
*Assistant Examiner* — Vicki B Booker
(74) *Attorney, Agent, or Firm* — Perkins Coie LLP

(57) ABSTRACT

An interconnect assembly includes a bond pad and an interconnect structure configured to electrically couple an electronic structure to the bond pad. The interconnect structure physically contacts areas of the bond pad that are located outside of a probe contact area that may have been damaged during testing. Insulating material covers the probe contact area and defines openings spaced apart from the probe contact area. The interconnect structure extends through the openings to contact the bond pad.

20 Claims, 9 Drawing Sheets

(51) Int. Cl.
  *H01L 29/40* (2006.01)
  *H01L 21/66* (2006.01)
  *H01L 23/00* (2006.01)
(52) U.S. Cl.
  CPC ............ *H01L 2224/13111* (2013.01); *H01L 2224/13124* (2013.01); *H01L 2224/13139* (2013.01); *H01L 2224/13147* (2013.01); *H01L 2224/13155* (2013.01); *H01L 2924/00014* (2013.01); *H01L 2924/1461* (2013.01)

(56) References Cited

U.S. PATENT DOCUMENTS

| | | | |
|---|---|---|---|
| 7,115,985 B2 * | 10/2006 | Antol | H01L 23/3171 257/700 |
| 7,411,135 B2 * | 8/2008 | Daubenspeck | H01L 22/24 174/261 |
| 8,101,433 B2 | 1/2012 | Akiba et al. | |
| 8,138,577 B2 | 3/2012 | Shi et al. | |
| 8,148,728 B2 | 4/2012 | Or-Bach et al. | |
| 8,158,489 B2 | 4/2012 | Huang et al. | |
| 8,168,476 B2 | 5/2012 | Suan Jeung et al. | |
| 8,193,615 B2 | 6/2012 | Haba et al. | |
| 2002/0016070 A1 * | 2/2002 | Friese | H01L 22/32 438/689 |
| 2005/0098903 A1 * | 5/2005 | Yong | H01L 22/32 257/786 |
| 2006/0278979 A1 | 12/2006 | Rangel | |
| 2009/0291524 A1 | 11/2009 | Takahashi | |
| 2010/0276787 A1 | 11/2010 | Yu et al. | |
| 2011/0031632 A1 | 2/2011 | Pratt | |
| 2012/0161316 A1 | 6/2012 | Gonzalez et al. | |
| 2014/0070832 A1 | 3/2014 | Fay et al. | |

* cited by examiner

METHODS FOR FORMING INTERCONNECT ASSEMBLIES WITH PROBED BOND PADS

CROSS-REFERENCE TO RELATED APPLICATION

This application is a divisional of U.S. patent application Ser. No. 13/614,286 filed Sep. 13, 2012, which is incorporated herein by reference in its entirety.

TECHNICAL FIELD

The present technology is related to microelectronic devices with interconnect assemblies and associated methods of manufacturing the same. In particular, the present technology is related to interconnect assemblies with probed bond pads.

BACKGROUND

Conventional microelectronic devices often have vertical electrical connections that extend through wafers or semiconductor dies. One type of vertical electrical connection is a through-silicon via ("TSV") often used in stacked semiconductor devices. A TSV in the wafer can be electrically coupled to a bond pad. A pillar can electrically couple the bond pad to another device, such as an active side of a semiconductor die. Before forming the pillar, wafer-level probing is often used to evaluate electrical characteristics of the wafer and involves contacting bond pads with probe pins to send electrical signals to the wafer. Unfortunately, the probe pins may damage (e.g., roughen, scratch, gouge, etc.) the bond pads. If a bond pad is made of aluminum, a probe pin can pass through a thin oxide layer on the bond pad and cause significant damage to the bond pad. Such damage is commonly referred to as a "probe mark" and may impact subsequent processing and decrease product yields.

FIGS. 1 and 2 show a portion of a bond pad assembly 90 of a conventional wafer 100. Referring to FIG. 1, the wafer 100 includes a polyimide layer 110 having an opening 120 at a central region of a probed bond pad 130 (illustrated in phantom) of the bond pad assembly 90. A probe mark in the form of an elongated groove 140 extends across an exposed surface 142 (FIG. 2) of the bond pad 130 and underneath the polyimide layer 110. The polyimide layer 110 is deposited and the openings 120 are formed by aligning and development after wafer-level probing. FIG. 2 shows unwanted residual material 144 (e.g., polyimide material at the bottom of the opening 120) left due to improper development of the polyimide layer 110. Such residual material 144 is often referred to as "scumming," and excess scumming may make it difficult to form a pillar (not shown) that contacts the bond pad 130.

FIG. 3 shows a stage of forming the opening 120 in the polyimide layer. Light rays or other radiation, represented by arrows, is used to develop the polyimide layer 110. The elongated groove 140 causes scattering of the radiation. For example, rays reflected from ends 143, 145 of the elongated groove 140 can travel towards the center of the opening 120 and cause crosslinking of the polyimide which results in insufficient development of the polyimide material. This can cause scumming in the form of a residual feature 150 to be left in the opening 120. The scattered radiation can also lead to improperly shaped openings (e.g., irregular shaped openings).

FIG. 4 shows an interface between a pillar 160 and a conventional probed bond pad 162. In this example, a probe mark 164 can result in a poor connection (e.g., an electrical connection, a mechanical connection, etc.) between the pillar 160 and the bond pad 162. The probe mark 164 may also have rough and irregular surfaces that prevent the formation of a uniform barrier/seed layer on the bond pad 162. When this occurs, a processing substance (e.g., an etchant, an etching solution, etc.) can pass through openings in the barrier/seed layer and corrode the underlying bond pad 162. If the bond pad 162 is made of aluminum, the upper surface of the bond pad 162 can experience significant corrosion and result in a poor electrical connection and decrease product yields.

DETAILED DESCRIPTION

Microelectronic devices can include interconnect assemblies that electrically couple microelectronic structures together. Microelectronic structures can include, without limitation, semiconductor structures (e.g., semiconductor dies or chips), wafers (e.g., wafers with integrated circuits, vias, bond pads, etc.), substrates, microelectromechanical systems ("MEMS"), memory, etc. The interconnect assemblies can include pads (e.g., probed bond pads) and interconnect structures (e.g., pillars) that physically contact one or more contact areas of the bond pads. The contact areas can be spaced laterally apart from probe contact areas of the probed bond pads such that probe marks, if any, are spaced apart from the interface of the interconnect structures and respective probed bond pads. A person skilled in the relevant art will understand that the present technology may have additional embodiments and that the present technology may be practiced without several of the details of the embodiments described below with reference to FIGS. 5-11.

Figure 5:
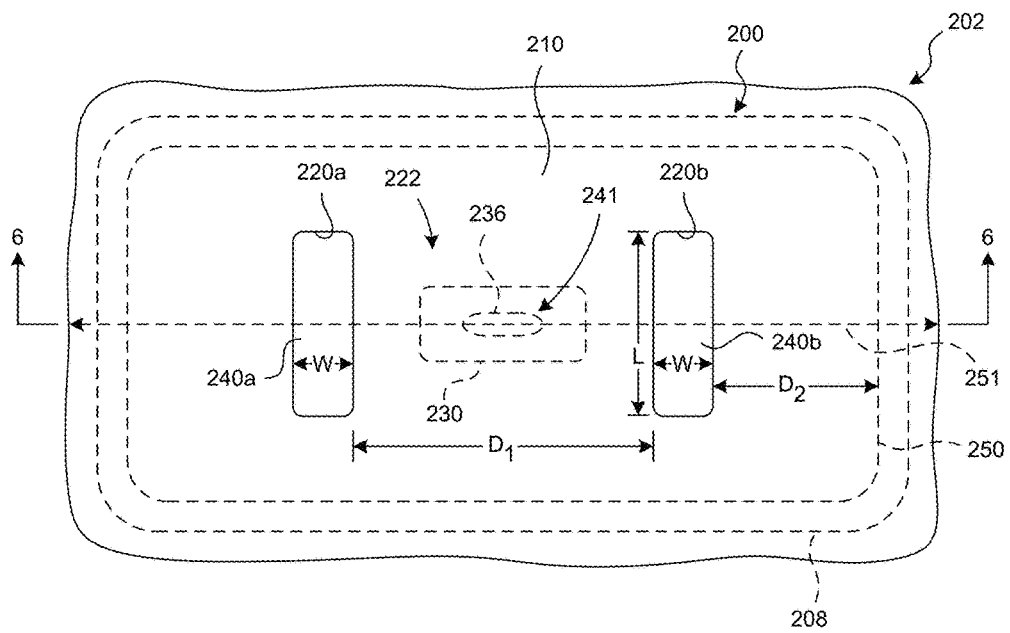
FIG. 5 is a schematic top plan view of a bond pad assembly in accordance with an embodiment of the present technology.

FIG. 5 is a schematic top plan view of a portion of a wafer-level bond pad assembly 200 ("assembly 200") of a semiconductor structure 202. The assembly 200 can include a bond pad 208 and insulating material 210. The insulating material 210 overlays the bond pad 208 and has a plurality of openings 220 spaced apart from one another (e.g., two openings identified as 220a and 220b). The openings 220a, 220b expose contact areas 240a, 240b of the bond pad 208, respectively, such that an interconnect structure (not shown) can be electrically coupled to the contact areas 240a, 240b, rather than where the probe mark is located. The openings 220 can be holes with generally rectangular cross sections. In other embodiments, the openings 220 can have substantially polygonal cross sections (e.g., square cross sections), circular cross sections, or other shapes. The openings 220 can be offset from a central region 241 of the bond pad 208, and the offset distance can be selected based on the shape and dimensions of the bond pad 208, the shapes and dimensions of the openings 220, accuracy of probing equipment, or the like.

The insulating material 210 has a portion 222 between the openings 220 that overlays a probe contact area 230 (shown in phantom) of the bond pad 208. In some embodiments, including the illustrated embodiment, the probe contact area 230 includes a damaged region in the form of a probe mark 236 that is spaced laterally apart from both openings 220. The configuration and the position of the probe contact area 230 can be selected to minimize, limit, or substantially eliminate scattering of light (e.g., light used to develop a polyimide layer), scumming, residual features, or other problems caused by probe marks.

With continued reference to FIG. 5, the distance $D_1$ between the openings 220 can be from about 15 μm to about 25 μm. The distance $D_1$ can be selected based on, for example, the configuration and dimensions of the component to be coupled to the bond pad 208. The probe mark 236 and/or the probe contact area 230 can be generally midway between the openings 220. Width W of the openings 220 can be equal to or less than about 12 μm. Length L of the openings 220 can be equal to or greater than about 36 μm. The semiconductor structure 202 can have a passivation material 250 spaced apart from the openings by a distance $D_2$ of about 10 μm or less. The distance $D_2$ can be in direction of a longitudinal axis 251 of the bond pad 208. In some embodiments, distance $D_1$, distance $D_2$, and width W can be equal to about 20 μm, 9 μm, 5 μm, respectively. Other dimensions are also possible for other applications.

Figure 6:
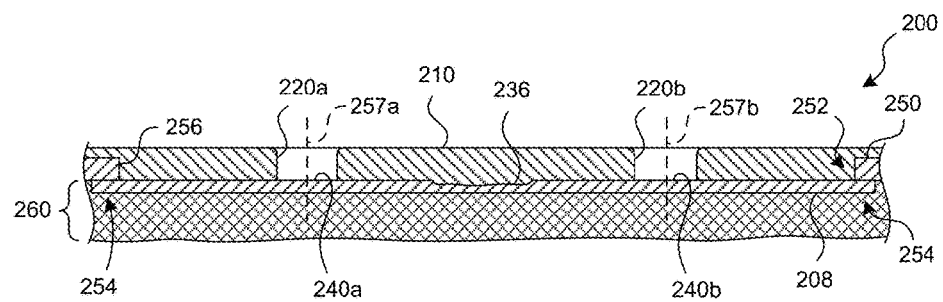
FIG. 6 is a schematic cross-sectional view of the bond pad assembly taken along line 6-6 of FIG. 5 in accordance with an embodiment of the present technology.

FIG. 6 is a schematic cross-sectional view of the assembly 200 further including passivation material 250 and a substrate 260. The passivation material 250 can be located between a periphery 254 of the bond pad 208 and the insulating material 210 and can electrically insulate circuitry in the substrate 260. An edge 256 of the passivation material 250 can define an opening 252 through which the insulating material 210 passes to contact the bond pad 208. The openings 220 can have uniform diameters or varying diameters along their axes 257a, 257b.

FIGS. 7A-7E are schematic cross-sectional views illustrating various stages in a method of manufacturing an interconnect assembly. Generally, the bond pad 208 is formed on the substrate 260 and probing equipment contacts the bond pad 208 to evaluate integrated circuitry the substrate 260. After probing, the insulating material 210 can be disposed onto the bond pad 208 to cover an area of the probed bond pad 208 that may have been damaged during probing. The openings 220 can be formed in the insulating material 210, and an interconnect structure can be formed to contact exposed areas of the probed bond pad 208. Details of the manufacturing method are discussed in connection with FIG. 7A-7E.

Figure 7A:
FIGS. 7A-7E are schematic cross-sectional views illustrating various stages in a method of manufacturing a microelectronic device in accordance with an embodiment of the present technology.

FIG. 7A is a schematic cross-sectional view of the substrate 260. The substrate 260 can include, without limitation, one or more vias (e.g., TSVs, blind vias, buried vias, etc.), vertical electrical connections, contacts, circuitry, or the like. In some embodiments, the substrate 260 is a wafer (e.g., a silicon wafer) with logic circuitry, light-emitting diodes ("LED") driver circuitry, and/or application-specific integrated circuits (ASIC). The substrate 260 can be part of a singulated device (e.g., a die, a chip, a memory device, etc.), microelectronic structure, or the like.

Figure 7B:
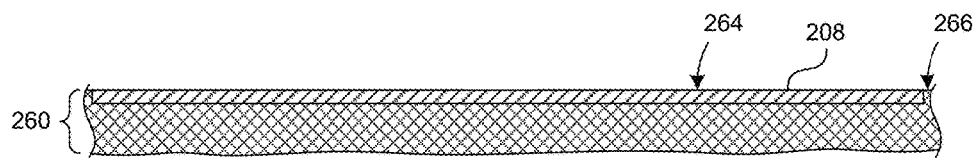

FIG. 7B is a cross-sectional view of the bond pad 208 on the substrate 260. The bond pad 208 can be formed by, for example, a plating process, a sputtering process, or other deposition processes. For example, a conductive material can be deposited on the substrate 260 and selectively removed using an etching process. The bond pad 208 can be an aluminum pad comprising, without limitation, doped aluminum (e.g., copper-doped aluminum, silicon-doped aluminum, etc.), aluminum alloys, or pure aluminum. Pure aluminum is a relatively soft metal and may be susceptible to significant damage, so dopants can be used to enhance the mechanical properties of aluminum to control or limit damage caused by, for example, probing (e.g., probe testing). Additionally, doped aluminum can have enhanced corrosion resistance in comparison to pure aluminum. In one doped embodiment, the bond pad 208 comprises copper-doped aluminum that contains about 0.5% copper by weight. In other embodiments, the copper-doped aluminum has other ranges of percentages of copper. In another doped embodiment, the bond pad 208 comprises silicon-doped aluminum that contains about 0.3%-0.5% silicon by weight. In other embodiments, the silicon-doped aluminum has other ranges of percentages of silicon. The doped aluminum pads can be terminal pads of a TSV or other type of vertical electrical connection. In other embodiments, the bond pad 208 can comprise, in whole or in part, copper or other electrically conductive materials. For example, the bond pad 208 can comprise mostly copper by weight. The substrate 260 can include an inner layer dielectric (ILD) that helps prevent deformation of the copper bond pad 208. Additionally or alternatively, a protection layer (e.g., a nickel-palladium layer) can be formed on the copper bond pad 208.

Figure 7C:
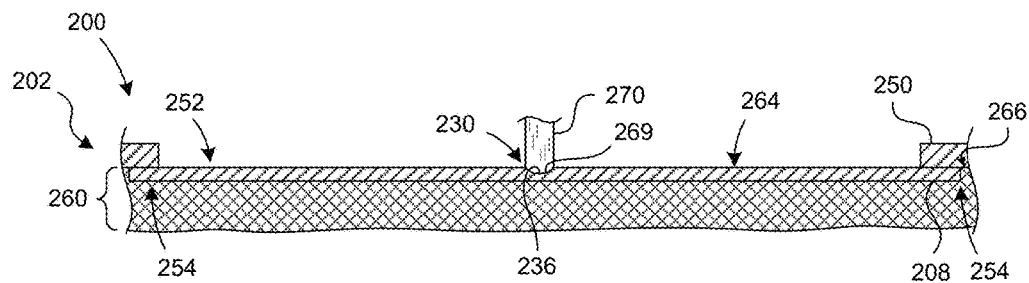

FIG. 7C is a schematic cross-sectional view of the semiconductor structure 202 contacted by a probe pin 270. After forming the bond pad 208, the passivation material 250 (e.g., nitride, silicon nitride, oxide, silicon dioxide, etc.) can be delivered (e.g., deposited, grown, etc.) on an upper surface 264 of the bond pad 208 and an upper surface 266 of the substrate 260. The passivation material 250 can be patterned and selectively removed to form the opening 252 such that the remaining portion of the passivation material 250 overlays the periphery 254 of the bond pad 208 and the substrate 260.

After forming the opening 252, the bond pad 208 is probed. FIG. 7C shows a probe pin 270 including a tip 269 physically contacting the probe contact area 230. Probing equipment (e.g., equipment configured to perform wafer-level probing) can target, for example, the probe contact area 230 located at the center of the bond pad 208 to prevent damage to the periphery 254 and to ensure that the tip 269 physically contacts the bond pad 208. Some probing protocols may include contacting the bond pad 208 with a series of different probe pins to evaluate, for example, operation of electric structures (e.g. circuitry, LEDs, MEMs structures, or the like) and can result in a significant amount of damage to the bond pad 208. Variations in probe pins and probing equipment can also result in probe pins contacting different locations of the bond pad 208. If the probing equipment becomes misaligned or malfunctions, probe pins may contact an area of the bond pad 208 outside of the probe contact area 230.

Figure 1:
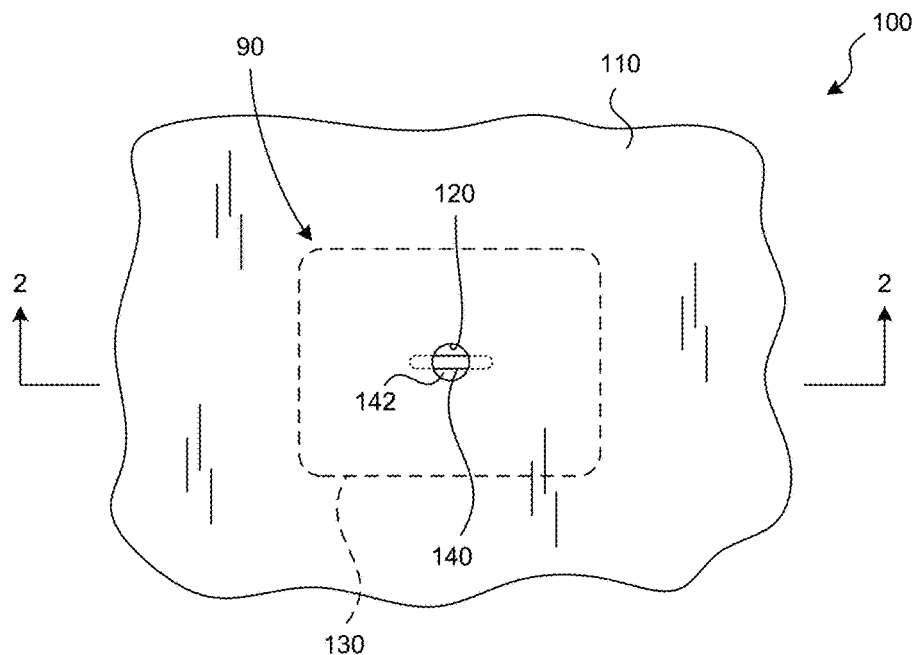
FIG. 1 is a schematic top plan view of a bond pad assembly of a wafer in accordance with the prior art.
Figure 2:
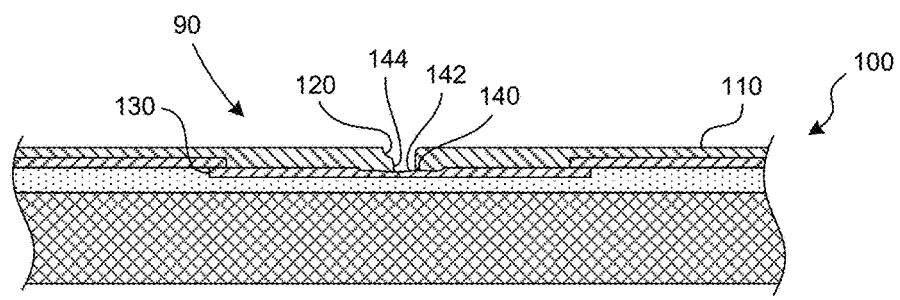
FIG. 2 is a schematic cross-sectional view of the wafer taken along line 2-2 of FIG. 1 in accordance with the prior art.
Figure 3:
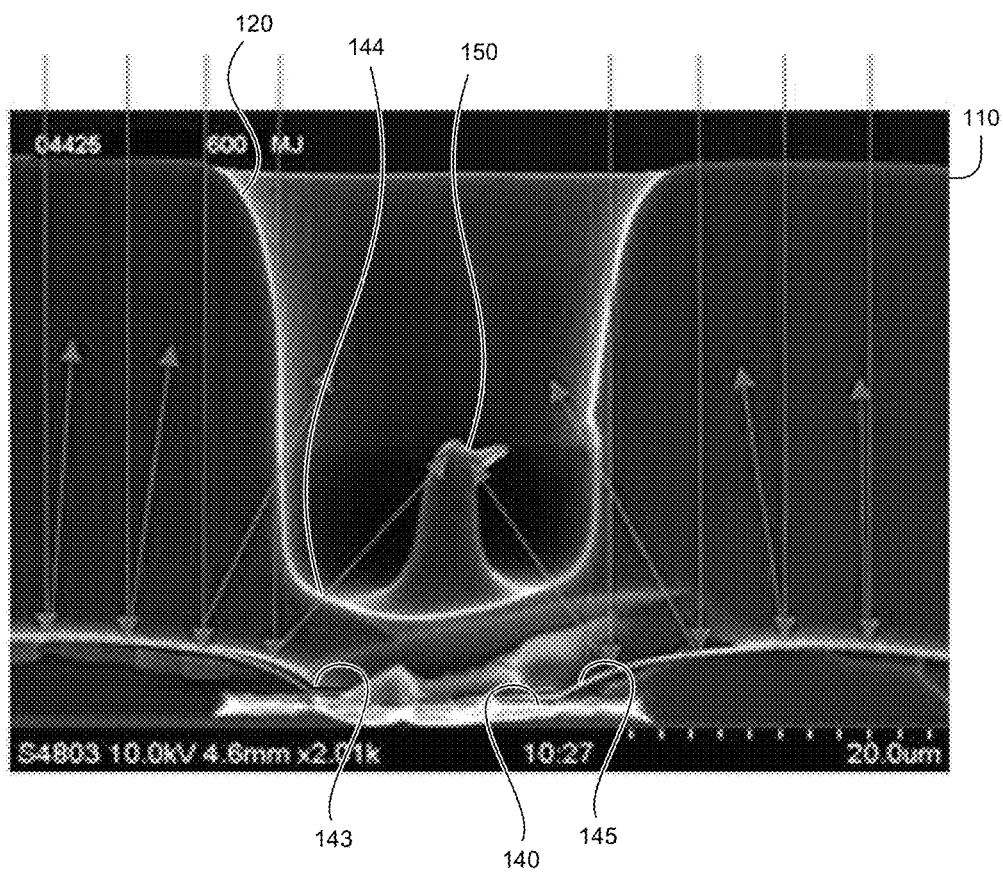
FIG. 3 shows an image of an opening in a polyimide layer in accordance with the prior art.
Figure 7D:
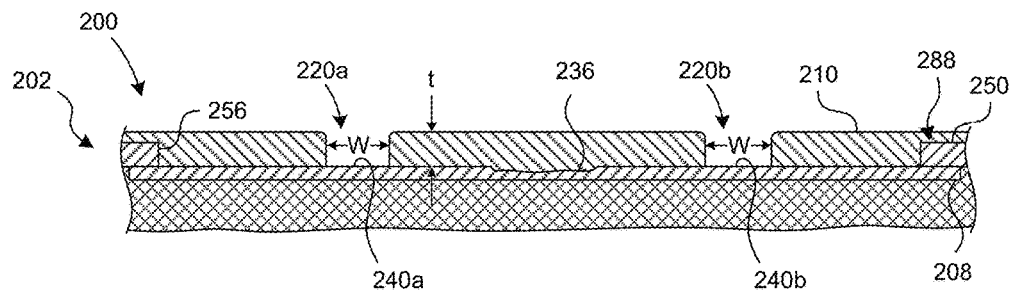

FIG. 7D is a schematic cross-sectional view of the assembly 200 after the insulating material 210 has been deposited onto the upper surface 264 of the bond pad 208 and an upper surface 288 of the passivation material 250. The insulating material 210 can comprise, in whole or in part, polyimide (e.g., a photosensitive polyimide with negative tone, a photosensitive polyimide with positive tone, etc.), epoxy (including epoxy variants), benzocyclobuten (BCB), or other dielectric material. In some embodiments, the insulating material 210 is a multilayer film comprising an adhesive material and a polyimide layer. In other embodiments, the insulating material 210 forms a single layer film comprising a dielectric material. The insulating material 210 can be patterned and selectively removed (e.g., etched) to form the openings 220. For example, each of the openings 220 can have a width W equal to or less than about 12 µm. In some embodiments, the widths H can be about 9 µm to about 12 µm. The sizes of the openings 220 can be selected based on the properties and thickness t of the insulating material 210 to prevent or limit scumming and/or the formation of residual features, such as the residual feature 150 discussed in connection with FIG. 3.

One expected advantage of several embodiments is if probe pins damage one of the exposed contact areas 240a, 240b, the other contact area 240a, 240b may not be damaged. For example, a probe pin may contact and damage the contact area 240a which may impair the formation of the opening 220a and/or impair the formation of an interconnect structure. However, the contact area 240b may not be damaged such that the opening 220b forms within specification to allow a portion of an interconnect structure (not shown in FIG. 7D) to contact the contact area 240b. The number of openings 220 can be increased to increase the redundancy of contacts points between an interconnect structure and the bonding pad 208 and/or the size, shape or locations of the openings 220 can be varied. In some embodiments, the insulating material 210 defines three or four openings to provide increased redundancy. For example, the insulating material 210 can be etched to define two circular openings and one elongated opening (e.g., a generally rectangular opening).

Figure 7E:
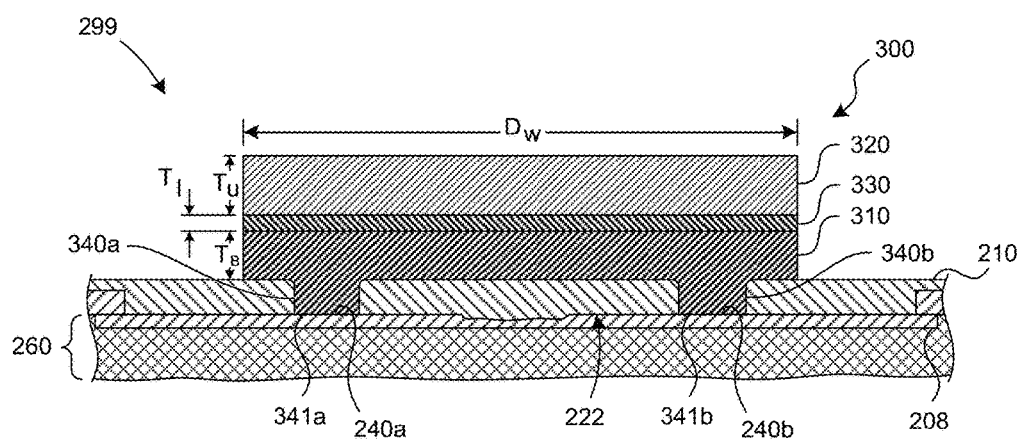

FIG. 7E is a cross-sectional view of an interconnection assembly 299 including the assembly 200 and an interconnect structure in the form of a pillar 300. The pillar 300 includes a base 310, an upper portion 320, and an intermediate portion 330 between the base 310 and upper portion 320. The base 310 includes two portions 340a, 340b that extend through the openings 220a, 220b, respectively, and have surfaces 341a, 341b that contact the areas 240a, 240b, respectively, to electrically couple the pillar 300 to the bond pad 208. If one of the portions 340a, 340b fails to electrically contact the bond pad 208, the other portion 340a, 340b can maintain the desired electrical connection. The portions 340a, 340b can be downward projections that define plug regions, which fill the openings 220.

One example method of forming the pillar 300 includes delivering a barrier material (e.g., titanium or other barrier material) onto the insulating material 210 and the contact areas 240a, 240b. If the bond pad 208 is an aluminum pad, the barrier material can protect the aluminum (e.g., pure aluminum, doped aluminum, etc.) from damage (e.g. corrosion). The contact areas 240a, 240b can be substantially flat to facilitate the formation of a generally uniform layer of barrier material that covers the entire contact areas 240a, 240b. Such barriers layers can protect the bond pad 208 from substances (e.g., a solution of acid, etchant, etc.) delivered through the openings 220a, 220b. The intermediate portion 330 and upper portion 320 can be plated or formed using other techniques. In some embodiments, the base 310 comprises copper, the intermediate portion 330 comprises nickel, and the upper portion 320 comprises tin, silver, and/or tin/silver alloys. The base 310, intermediate portion 330, and upper portion 320 can comprise other conductive materials. A distance $D_w$ of the pillar 300 can be equal to about 30 µm, a thicknesses $T_B$ can be equal to about 15 µm, a thicknesses $T_1$ can be equal to about 3 µm, and a thickness $T_u$ can be equal to about 15 µm. The number of layers, composition of the layers, dimensions of the layers, and dimensions of the pillar 300 (e.g., height, width, length, etc.) can be selected based on the microelectronic structure (e.g., stack of memory, LED structure, etc.) to be electrically coupled to the substrate 260. In other embodiments, the pillar 300 can have a one-piece or unitary construction and can comprise a single conductive material, such as copper or aluminum.

With continued reference to FIG. 7E, the portion 222 of the insulating material 210 is positioned between the probe contact area 230 (see FIG. 5) and the base 310 such that the base 310 contacts only areas of the bond pad 208 located outside of the probe contact area 230 (see FIG. 5). The substrate 260 can carry an array of similar pillars formed at a desired pitch (e.g., 30 µm, 40 µm, 50 µm, etc.). Components (e.g., microelectronic substrates or structures, memory, etc.) can be vertically stacked utilizing the pillars to limit the overall package size. For example, memory can be stacked in vertical arrangement using the interconnection assemblies discussed herein.

Figure 8:
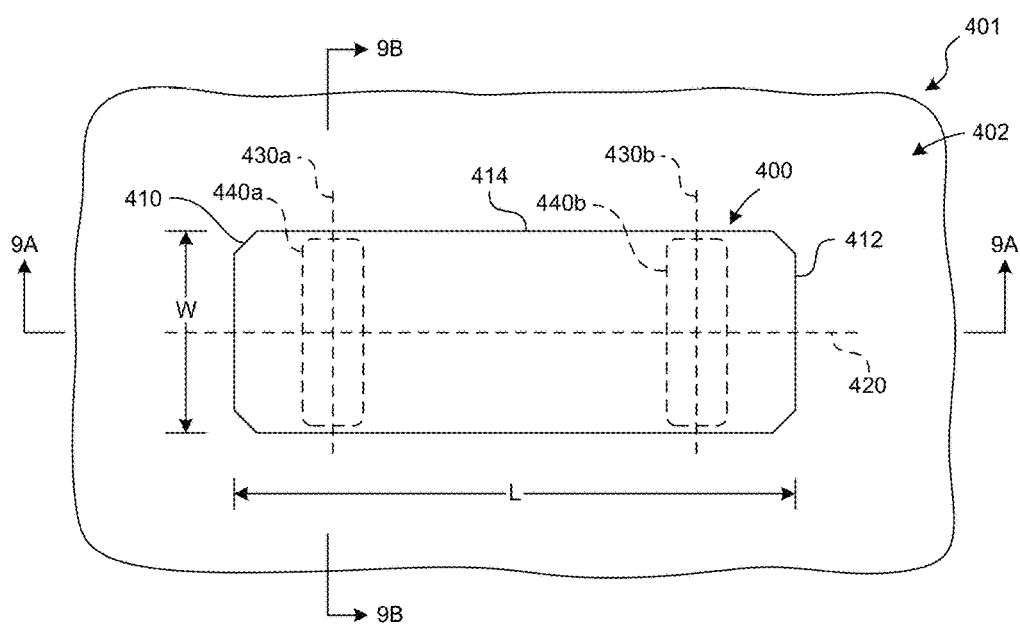
FIG. 8 is a schematic top plan view of a bond pad assembly in accordance with an embodiment of the present technology.

FIG. 8 is a schematic top plan view of a portion of a wafer-level interconnect assembly 401 ("assembly 401") including a bond pad assembly 402 and an interconnect structure in the form of a pillar 400. The pillar 400 has first and second ends 410, 412 and an elongated main body 414 extending between the first and second ends 410, 412. A longitudinal axis 420 of the pillar 400, as viewed from above, can be generally perpendicular to longitudinal axes 430a, 430b of respective openings 440a, 440b (illustrated in phantom). The pillar 400 can have a generally oblong shape (e.g., a rectangular shape, an elliptical shape, etc.) to ensure that the pillar 400 covers both openings 440a, 440b. The pillar 440 can be generally centered over an underlying bond pad for generally vertical stacking, thereby avoiding offset die stacking. A length L can be about two times, three times, four times, five times, or ten times the width W of the pillar 400. Other dimensions are also possible.

Figure 9A:
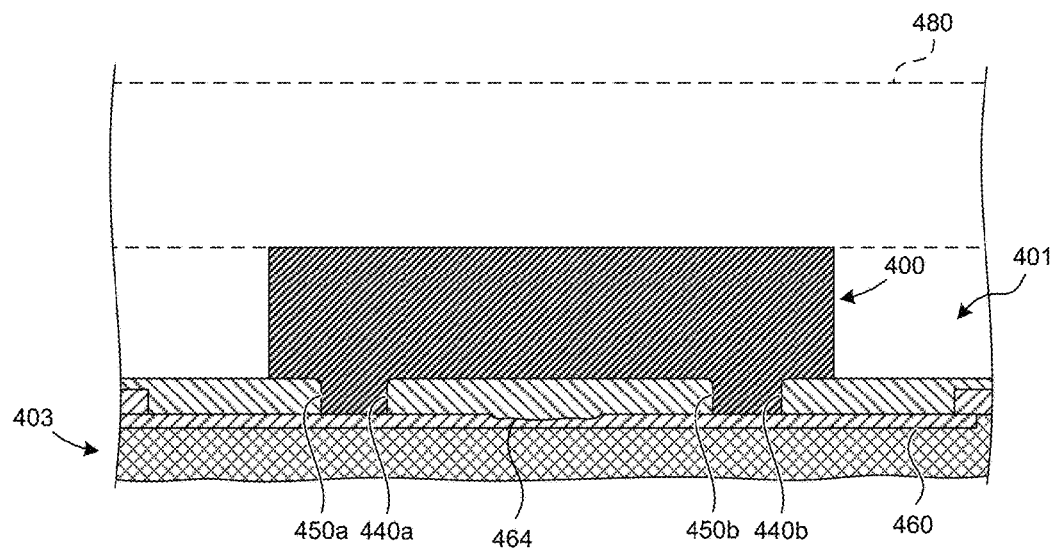
FIG. 9A is a schematic cross-sectional view of the wafer-level bond pad assembly taken along line 9A-9A of FIG. 8 in accordance with an embodiment of the present technology.
Figure 9B:
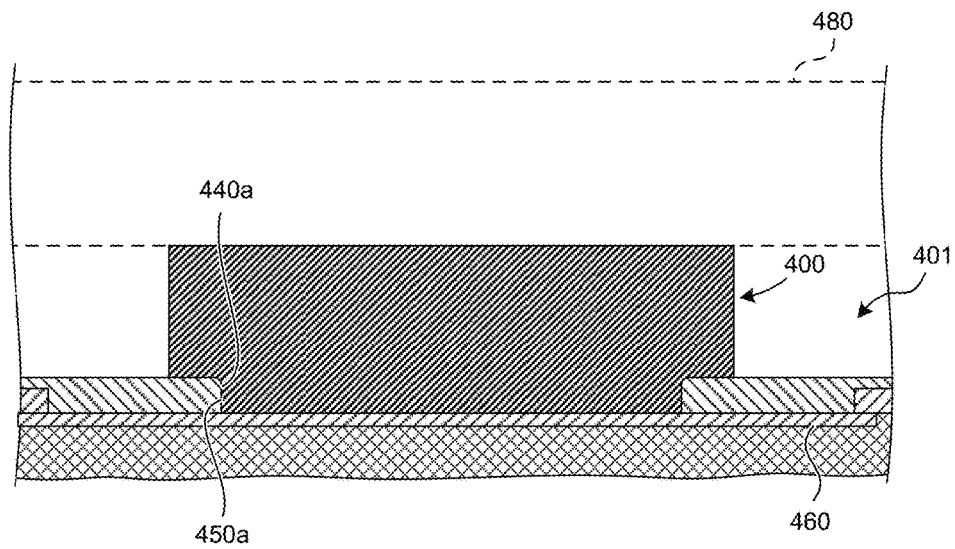
FIG. 9B is a schematic cross-sectional view of the wafer-level bond pad assembly taken along line 9B-9B of FIG. 8 in accordance with an embodiment of the present technology.

FIGS. 9A and 9B are cross-sectional views of the assembly 401. The pillar 400 can further include first and second portions 450a, 450b extending through openings 440a, 440b, respectively, to contact a probed bond pad 460. The first and second portions 450a, 450b are spaced apart from a damaged region 464 (FIG. 9A) and protrude from the main body 414. The pillar 400 electrically couples a structure 480 (shown in phantom) to the bond pad 460. (The structure 480 is not shown in FIG. 8.) Different types of assembling processes can used to couple the structure 480 (e.g., a microelectronic substrate, a semiconductor substrate, a microelectronic device, etc.) to the pillar 400. In some embodiments, a stack of semiconductor devices are stacked using the assemblies 401 to produce memory (e.g., random access memory, dynamic random-access memory, read-only memory, etc.). In some embodiments, the structure 480 is memory and a substrate 403 is logic mountable to a substrate. In some embodiments, the structure 480 is a MEMS structure and the substrate 403 is ASIC mountable to a circuit board (e.g., a printed circuit board). In some embodiments, the structure 480 is an LED and the substrate 403 is an LED driver mountable to a circuit board.

Figure 10:
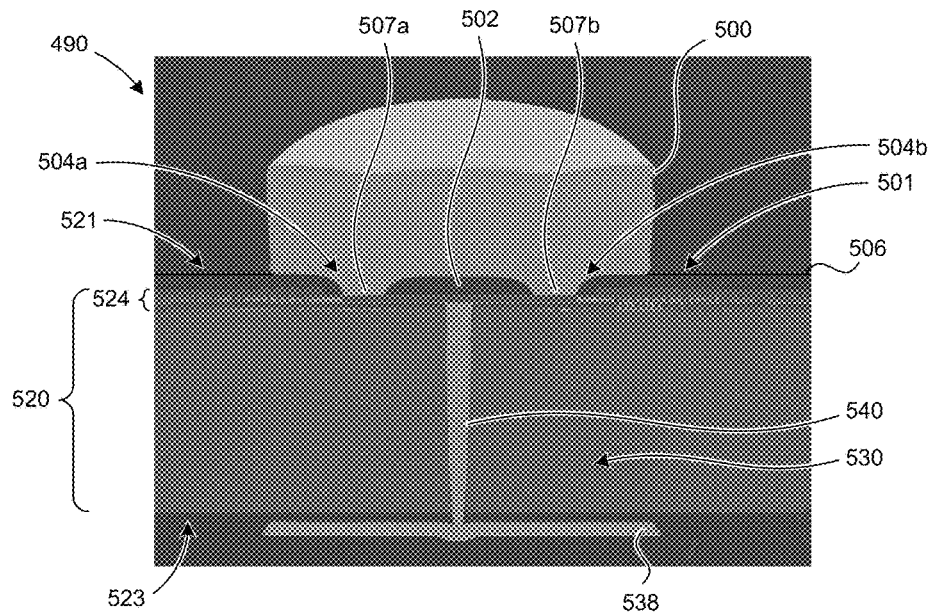
FIG. 10 shows an image of an interconnect structure extending through two openings in an insulating material in accordance with an embodiment of the present technology.
Figure 11:
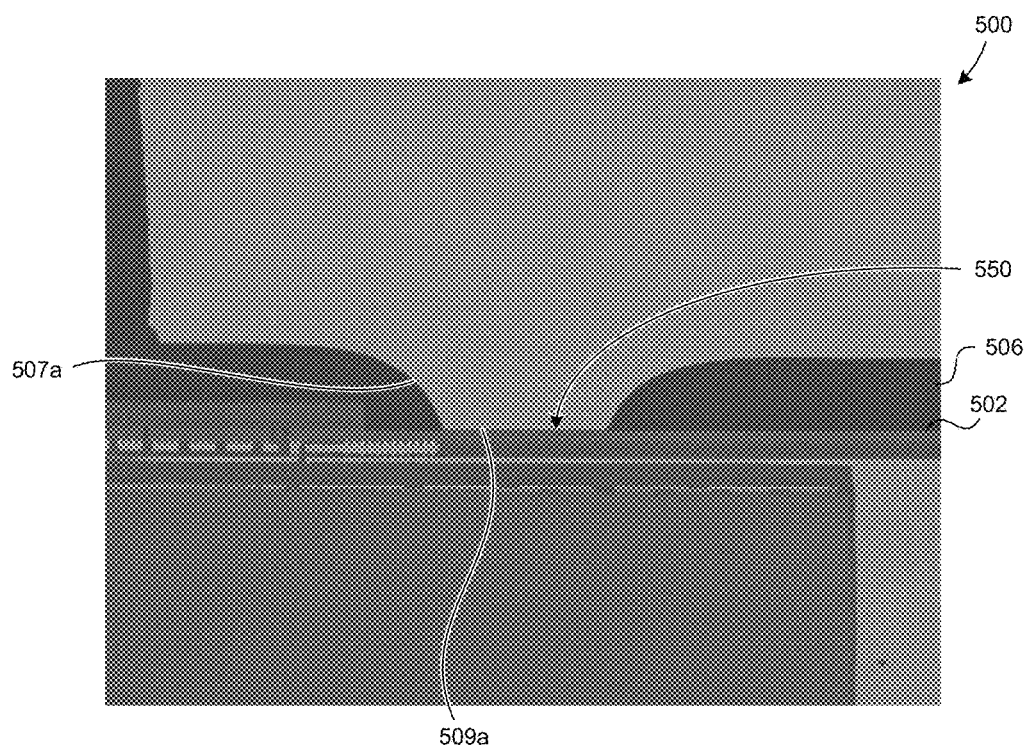
FIG. 11 shows an image of a portion of the interconnect structure of FIG. 10 contacting a probed bond pad in accordance with an embodiment of the present technology.

FIG. 10 shows an image of a wafer-level interconnect assembly 490 ("assembly 490"), and FIG. 11 is an image of a portion 507a of a pillar 500. Referring to FIG. 10, the assembly 490 includes the pillar 500 coupled to a bond pad assembly 501. The bond pad assembly 501 includes a bond pad 502 and an insulating material 506 having two openings 504a, 504b. The pillar 500 has portions 507a, 507b extending through the openings 504a, 504b, respectively, to contact the bond pad 502.

The assembly 490 further includes a semiconductor structure 520 having an active side 521, a backside 523, and an electrical connection 530. The active side 521 includes circuitry 524 that can include, without limitation, the bond pad 502, integrated circuits, transistors, vias, metal layers, or the like. The electrical connection 530 can include a backside feature 538 (e.g., a redistribution line, a pad, etc.) and a TSV 540 extending through bulk silicon (e.g., bulk silicon of a wafer). The TSV 540 can electrically couple the circuitry 524 to the backside feature 538.

Figure 4:
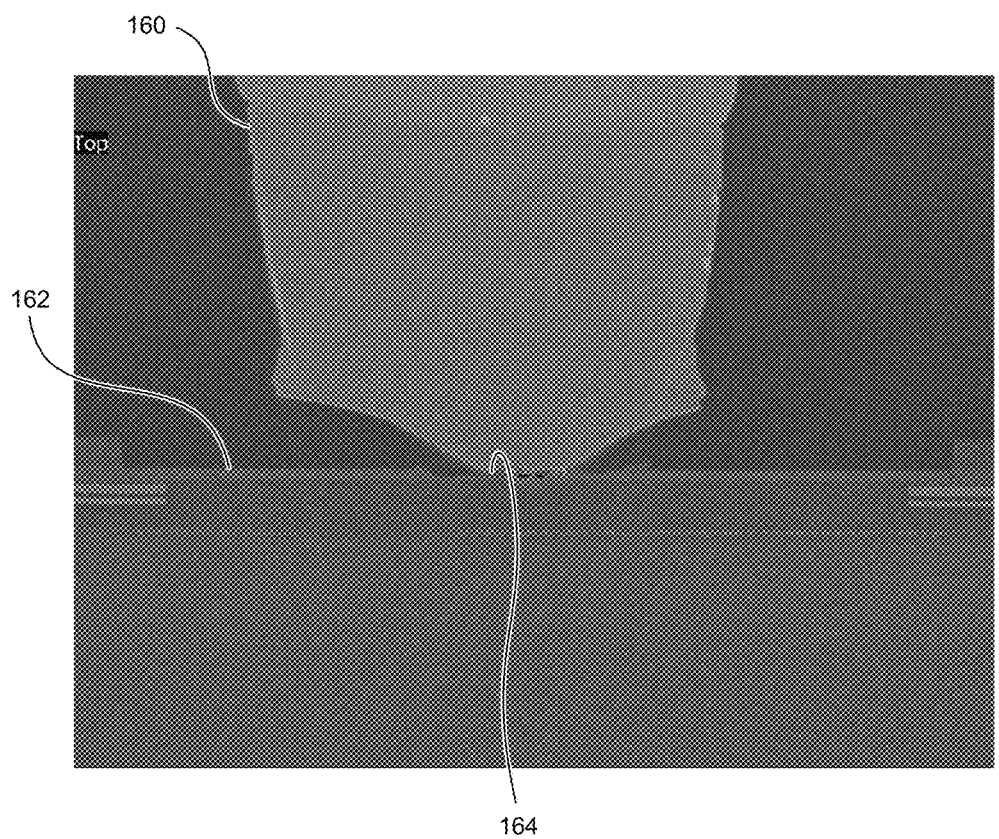
FIG. 4 shows a pillar connected to a bond pad assembly in accordance with the prior art.

Referring to FIG. 11, the portion 507a includes a substantially flat surface 509a that contacts a contact area 550 of the bond pad 502. The surface 509a is substantially flatter than the surface of the bond pad 162 shown in the conventional structure of FIG. 4 discussed above. The insulating layer 506 of FIG. 11 has been fully developed to provide the scum-free contact area 550 of the bond pad 502. An interface between the flat surface 509a and the contact area 550 is also substantially free of any corrosion and any residual feature that would cause electrical resistance to provide a reliable mechanical connection.

From the foregoing, it will be appreciated that specific embodiments of the invention have been described herein for purposes of illustration, but well-known structures and functions have not been shown or described in detail to avoid unnecessarily obscuring the description of at least some embodiments of the invention. Where the context permits, singular or plural terms may also include the plural or singular term, respectively. Unless the word "or" is associated with an express clause indicating that the word should be limited to mean only a single item exclusive from the other items in reference to a list of two or more items, then the use of "or" in such a list shall be interpreted as including (a) any single item in the list, (b) all of the items in the list, or (c) any combination of the items in the list.

Certain aspects of the technology described in the context of particular embodiments may be combined or eliminated in other embodiments. Embodiments disclosed herein can be used in chip-to-wafer assemblies, chip-to-chip assemblies, chip-to-substrates, or the like. A wide range of packages and electronic devices (e.g., cell phones computer, etc.), lighting systems, sensors (e.g., accelerometers, gyroscopes, etc.) can include the embodiments disclosed herein. The embodiments disclosed herein can be part of microelectronic devices, such as memory, LED lighting systems, MEMS sensors, or the like. The embodiments disclosed herein can be used in large scale production. For example, an array of space part interconnect assemblies can be formed along a substrate (e.g. a wafer). An array of semiconductor devices can be mounted on the interconnect assemblies. After forming the desired stack structures, the substrate can be singulated and the individual structures can be packaged. Further, while advantages associated with certain embodiments have been described in the context of those embodiments, other embodiments may also exhibit such advantages, and not all embodiments need necessarily exhibit such advantages to fall within the scope of the present technology. Accordingly, the present disclosure and associated technology can encompass other embodiments not expressly described or shown herein.

What is claimed is:

1. A method of manufacturing an assembly, comprising:
disposing material onto a bond pad of a semiconductor structure to cover a probe mark at a probe contact area of the bond pad;
forming a first opening and a second opening in the material, wherein the first opening and the second opening are spaced apart from one another and the probe mark is directly between the first and second openings; and
forming an interconnect structure that extends through the first opening and the second opening to couple the interconnect structure to the bond pad.

2. The method of claim 1, further comprising contacting the probe contact area of the bond pad with a probe pin before disposing the material onto the bond pad.

3. The method of claim 1, further comprising coupling a semiconductor die to the interconnect structure to electrically couple the semiconductor die to the bond pad of the semiconductor structure.

4. The method of claim 1, further comprising:
disposing passivation material onto the bond pad; and
removing at least a portion of the passivation material to expose the bond pad before disposing the material onto the bond pad.

5. The method of claim 1, further comprising forming the bond pad which is electrically coupled to a through-silicon via of the semiconductor structure before disposing the material onto the bond pad.

6. The method of claim 1 wherein forming the interconnect structure comprises forming a pillar including a base, an upper portion, and an intermediate portion between the base and the upper portion.

7. The method of claim 1 wherein a portion of the material is underlying the interconnect structure and covers the probe mark.

8. The method of claim 1 wherein the interconnect structure physically contacts only areas of the bond pad spaced apart from the probe mark.

9. The method of claim 1, further comprising testing the semiconductor structure using a probe configured to physically contact the probe contact area.

10. The method of claim 1, further comprising physically damaging, via a probing instrument, an exposed surface of the bond pad.

11. The method of claim 1 wherein the material covers the entire probe mark.

12. A method of manufacturing an assembly, comprising:
   physically contacting a bond pad of a semiconductor structure with a probe pin such that the probe pin produces a probe mark along the bond pad;
   disposing material onto the bond pad to cover the probe mark;
   forming a first opening and a second opening in the material, wherein the first opening and the second opening are spaced apart from the probe mark; and
   forming an interconnect structure that extends through the first opening and the second opening to couple the interconnect structure to the bond pad, wherein a section of the material is located directly between the interconnect structure and the probe mark.

13. The method of claim 12 wherein disposing the material onto the bond pad includes:
   disposing passivation material onto the bond pad; and
   removing at least a portion of the passivation material to expose the bond pad before disposing the material onto the bond pad.

14. The method of claim 12 wherein the material disposed on the bond pad covers the entire probe mark.

15. The method of claim 12, further comprising:
   disposing passivation material onto the bond pad; and
   removing at least a portion of the passivation material before disposing the material onto the bond pad.

16. The method of claim 12 wherein the probe mark is directly between the first and second openings.

17. The method of claim 12 wherein the entire probe mark is spaced apart from areas of the bond pad physically contacted by the interconnect structure.

18. The method of claim 12, further comprising removing material from the bond pad to expose the bond pad before forming the probe mark.

19. The method of claim 12, further comprising testing the semiconductor structure using a probe configured to physically contact the bond pad.

20. The method of claim 12, wherein forming the interconnect structure comprises forming a pillar including a base, an upper portion, and an intermediate portion between the base and the upper portion.

* * * * *